United States Patent
Ohba et al.

(10) Patent No.: US 9,017,155 B2
(45) Date of Patent: Apr. 28, 2015

(54) AIR CONDITIONING INSTALLATION AND CONTROL METHOD

(75) Inventors: Yuji Ohba, Kawasaki (JP); Junichi Ishimine, Kawasaki (JP); Ikuro Nagamatsu, Kawasaki (JP); Masahiro Suzuki, Kawasaki (JP); Tadashi Katsui, Kawasaki (JP); Nobuyoshi Yamaoka, Kawasaki (JP); Seiichi Saito, Kawasaki (JP); Akira Ueda, Kawasaki (JP); Yasushi Uraki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 970 days.

(21) Appl. No.: 12/813,884

(22) Filed: Jun. 11, 2010

(65) Prior Publication Data
US 2010/0330896 A1 Dec. 30, 2010

(30) Foreign Application Priority Data
Jun. 25, 2009 (JP) .................................. 2009-151454

(51) Int. Cl.
*H05K 5/02* (2006.01)
*H05K 7/20* (2006.01)
(Continued)

(52) U.S. Cl.
CPC ........ *H05K 7/20745* (2013.01); *F24F 11/0001* (2013.01); *F24F 11/053* (2013.01)

(58) Field of Classification Search
CPC .............. F24F 11/0001; F24F 11/053; H05K 7/20209; H05K 7/20745; H05K 7/20836
USPC ............. 454/184, 229, 239; 236/49.3; 62/157
See application file for complete search history.

(56) References Cited

U.S. PATENT DOCUMENTS

| 5,467,607 | A | 11/1995 | Harvey |
| 7,907,402 | B2 * | 3/2011 | Caveney .................. 361/694 |
| 2003/0067745 | A1 | 4/2003 | Patel et al. |

(Continued)

FOREIGN PATENT DOCUMENTS

| CN | 101173817 A | 5/2008 |
| GB | 2 424 126 A | 9/2006 |

(Continued)

OTHER PUBLICATIONS

Chinese Office Action dated Jun. 29, 2012, issued in corresponding Chinese Patent Application No. 201010214715.9, (12 pages). With English Translation.
United Kingdom Office Action dated Oct. 4, 2010, issued in corresponding United Kingdom Patent Application No. 1009210.4.

*Primary Examiner* — Gregory Huson
*Assistant Examiner* — Dana Tighe
(74) *Attorney, Agent, or Firm* — Westerman, Hattori, Daniels & Adrian, LLP

(57) ABSTRACT

An installation for cooling an electronic device includes an air conditioner having an air outlet for blowing cooling air to a room; a first detector adjacent to the air outlet of the air conditioner, for detecting a temperature of the cooling air; a rack accommodating the electronic device, the rack having an air inlet for receiving the cooling air from the air conditioner and an air outlet for exhausting air to the room; a second detector adjacent to the air inlet of the rack, for detecting a temperature of air received through the air inlet of the rack; and a controller for acquiring the temperatures detected by the first and the second detectors, and controlling a quantity of the cooling air blown from the air outlet of the air conditioner so as to decrease a difference between the temperatures detected by the first and the second detectors.

4 Claims, 5 Drawing Sheets

(51) Int. Cl.
*F24F 11/00* (2006.01)
*F24F 11/053* (2006.01)

(56) References Cited

U.S. PATENT DOCUMENTS

| | | | |
|---|---|---|---|
| 2005/0023363 A1* | 2/2005 | Sharma et al. | 236/49.3 |
| 2008/0055850 A1* | 3/2008 | Carlson et al. | 361/695 |
| 2008/0098763 A1 | 5/2008 | Yamaoka | |
| 2008/0249519 A1* | 10/2008 | Goldman et al. | 606/27 |
| 2009/0061756 A1* | 3/2009 | Germagian | 454/184 |
| 2009/0168345 A1* | 7/2009 | Martini | 361/691 |
| 2009/0326721 A1* | 12/2009 | Sugiyama et al. | 700/282 |
| 2010/0029193 A1* | 2/2010 | Ahladas et al. | 454/184 |

FOREIGN PATENT DOCUMENTS

| | | |
|---|---|---|
| JP | 2004-184070 A | 7/2004 |
| JP | 2005-260148 A | 9/2005 |
| JP | 2006-504919 A | 2/2006 |
| JP | 2006-114669 A | 4/2006 |
| JP | 2006-526205 A | 11/2006 |
| JP | 2007-505285 A | 3/2007 |
| JP | 2008-502082 A | 1/2008 |
| WO | 03/089845 A1 | 10/2003 |
| WO | 2004/083743 A2 | 9/2004 |
| WO | 2004/107142 A2 | 12/2004 |
| WO | 2005/122664 A1 | 12/2005 |
| WO | WO 2009059649 A1 * | 5/2009 |

* cited by examiner

AIR CONDITIONING INSTALLATION AND CONTROL METHOD

CROSS-REFERENCE TO RELATED APPLICATIONS

This application is based upon and claims the benefit of priority of the prior Japanese Patent Application No. 2009-151454, filed on Jun. 25, 2009, the entire contents of which are incorporated herein by reference.

FIELD

The embodiments discussed herein are related to an air conditioning installation and an air conditioning control method that control the quantity of air from an air conditioner.

BACKGROUND

In recent years, a rack is installed in a space called data center or server room. IT devices, such as servers and network devices, are stacked in the rack. Since the IT devices include functional parts, for example, CPUs, the IT devices use power and generate heat. The temperatures of the IT devices have to be maintained at a certain temperature or lower for assurance of the operation. Hence, an air conditioning installation is used. The air conditioning installation cools the IT devices in the rack by blowing cooling air from an air conditioner.

The air circulation by the air conditioning installation will be described below. The air conditioner blows the cooling air, to supply the rack with the cooling air. Fans embedded in the IT devices in the rack suck the cooling air. The cooling air cools the functional parts, for example, CPUs. The cooling air absorbs the heat of the IT devices and becomes the heated air. The heated air at a relatively high temperature is exhausted through exhaustion ports in the back surfaces of the IT devices. Then, the air conditioner takes in the exhausted air.

As the heat density of the IT devices in the rack increases, the heat value per rack tends to increase. A hot spot that may be generated because the exhausted air flows around the rack and the hot spot may be a bottleneck. In particular, a hot spot may be generated in the data center because the quantity of cooling air at a relatively low temperature supplied from the air conditioner is insufficient for the quantity of air to be used for cooling the IT devices. For example, when the supplied air quantity for a rack is insufficient, the insufficiency is covered with the exhausted air at a relatively high temperature from that rack or a rack adjacent thereto. Consequently, the introduction temperature of the rack increases.

A technique that reduces the likelihood of generation of such a hot spot may be a method that reduces the likelihood of generation of a hot spot by installing an additional air conditioner to increase the quantity of cooling air. Alternatively, there is a technique that reduces the likelihood of generation of a hot spot by installing a local air conditioner near the position at which a hot spot is generated (for example, see Japanese Laid-open Patent Publication No. 2006-114669).

Still alternatively, there is another technique that reduces the likelihood of generation of a hot spot by providing an aisle capping to divide an aisle into a cool aisle for circulation of the cooling air and a hot aisle for circulation of the heated air (for example, see Japanese Laid-open Patent Publication No. 2004-184070 and No. 2005-260148). Yet alternatively, there is a technique that reduces the likelihood of generation of a hot spot by combining the local air conditioner with the aisle capping, and providing a closed space in a data center (for example, see International Publication No. WO2004/083743 (corresponding to Japanese Laid-open Patent Publication No. 2006-526205) and International Publication No. WO2005/122664 (corresponding to Japanese Laid-open Patent Publication No. 2008-502082)).

Yet alternatively, there is a technique that monitors the introduction temperature state of the rack, detects the presence of a hot spot through comparison with a re-circulation index or a prepared template value, and controls the quantity and temperature of the air from the air conditioner (for example, see International Publication No. WO2003/089845 (corresponding to Japanese Laid-open Patent Publication No. 2006-504919) and International Publication No. WO2004/107142 (corresponding to Japanese Laid-open Patent Publication No. 2007-505285)).

However, with the technique that provides the additional air conditioner or the local air conditioner, the power consumption may increase because the additional air conditioner or local air conditioner is operated. Consequently, it is difficult to efficiently cool the rack.

With the technique that provides the aisle capping, the aisle is divided into the cool aisle for the circulation of the cooling air and the hot aisle for the circulation of the heated air. Unfortunately, the balance between the quantity of the air to be used for cooling the rack, and the supplied quantity of the air from the air conditioner is not considered. Thus, for example, if the supplied quantity of the cooling air is insufficient, the heated air may flow into the cool aisle. Consequently, the rack may not be properly cooled.

With the technique that monitors the introduction temperature state of the rack, detects the presence of a hot spot, and controls the air quantity, the air quantity is controlled only after the temperature increases. If the temperature rapidly increases, the response may be delayed. It is difficult to properly cool the rack.

SUMMARY

According to an aspect of the invention, an installation for cooling an electronic device provided in a room, includes an air conditioner having an air outlet for blowing cooling air to the room; a first detector adjacent to the air outlet of the air conditioner, for detecting a temperature of the cooling air; a rack accommodating the electronic device, the rack having an air inlet for receiving the cooling air from the air conditioner and an air outlet for exhausting air to the room; a second detector adjacent to the air inlet of the rack, for detecting a temperature of air received through the air inlet of the rack; and a controller for acquiring the temperature detected by the first detector and the temperature detected by the second detector, and controlling a quantity of the cooling air blown from the air outlet of the air conditioner so as to decrease a difference between the temperatures detected by the first and the second detectors.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

An air conditioning installation, an air conditioning control method, and an air conditioning control program according to embodiments of the invention will be described below with reference to the attached drawings.

First Embodiment

In the following embodiment, a configuration and a process of an air conditioning installation 1 according to a first embodiment will be described, and then advantages attained by the first embodiment will be described.

Figure 1:
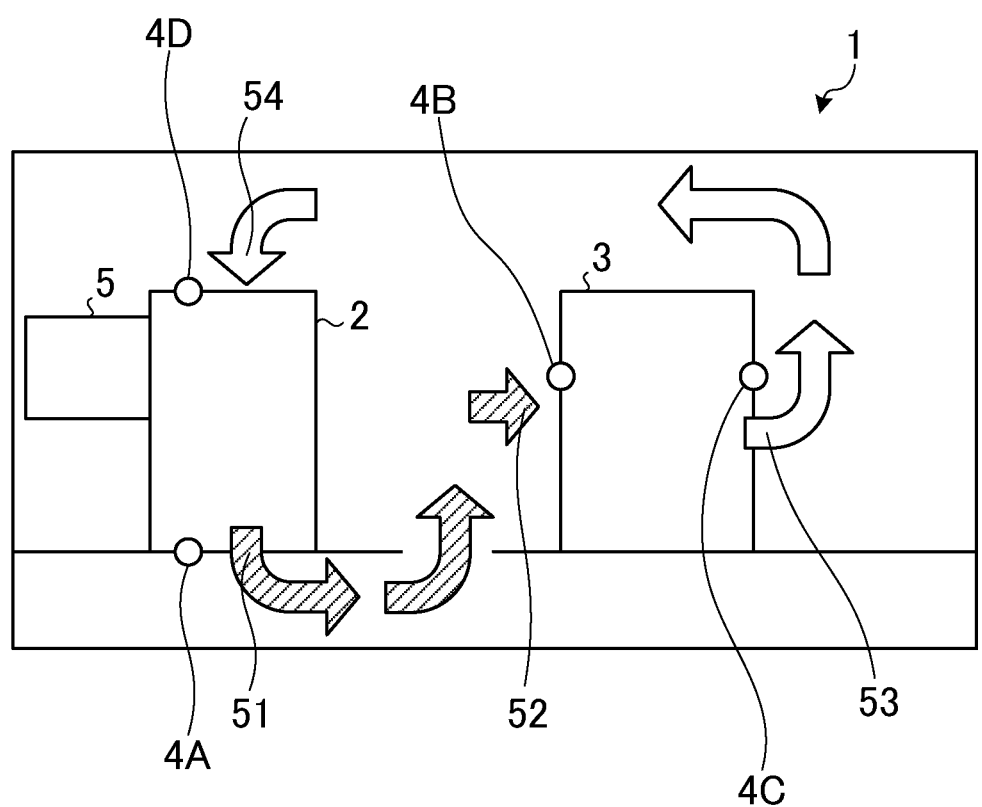
FIG. 1 is a block diagram of a configuration of an air conditioning installation according to a first embodiment.

The configuration of the air conditioning installation 1 according to the first embodiment will be described with reference to FIG. 1. FIG. 1 explains the configuration of the air conditioning installation 1 according to the first embodiment.

Referring to FIG. 1, the air conditioning installation 1 of the first embodiment includes an air conditioner 2 that blows cooling air to a rack 3, the rack 3 that receives the cooling air from the air conditioner 2 and exhausts heated air, temperature detectors 4A to 4D that detect temperatures, and an air quantity control unit 5 that controls the quantity of the air from the air conditioner 2. In FIG. 1, hatched arrows indicate the flow of the cooling air, and white arrows indicate the flow of the heated air.

The air conditioner blow temperature detector 4A detects the temperature of the cooling air 51 blown from an outlet (not illustrated in FIG. 1) of the air conditioner 2. The rack introduction temperature detector 4B detects the temperature of the cooling air 52 when the rack 3 receives the cooling air through an inlet (not illustrated in FIG. 1) of the rack 3.

The air quantity control unit 5 controls the quantity of air from the air conditioner 2 to decrease the difference between the temperature detected by the air conditioner blow temperature detector 4A and the temperature detected by the rack introduction temperature detector 4B.

For example, if the temperature of the cooling air when the rack 3 receives the cooling air is higher than the temperature of the cooling air blown from the air conditioner 2, the air quantity control unit 5 determines that the air quantity is insufficient, and increases the quantity of air from the air conditioner 2 to decrease the temperature difference.

The rack exhaustion temperature detector 4C detects a rack exhaustion temperature that is the temperature of the heated air 53 exhausted from an exhaust outlet (not illustrated in FIG. 1) of the rack 3, which has received the cooling air 51 blown from the outlet of the air conditioner 2. The air conditioner return temperature detector 4D detects an air conditioner return temperature that is the temperature of the heated air 54 when the air conditioner 2 takes in through an inlet (not illustrated in FIG. 1) of the air conditioner 2.

The air quantity control unit 5 controls the quantity of air from the air conditioner 2 to decrease the difference between the rack exhaustion temperature detected by the rack exhaustion temperature detector 4C and the air conditioner return temperature detected by the air conditioner return temperature detector 4D.

For example, if the air quantity control unit 5 judges that the rack exhaustion temperature is higher than the air conditioner return temperature, the cooling air may be excessive. The air quantity control unit 5 determines that the cooling air may cool even the heated air that does not have to be cooled, and decreases the quantity of air from the air conditioner 2 to decrease the difference between the rack exhaustion temperature and the air conditioner return temperature.

As described above, since the air conditioning installation 1 can efficiently and properly cool the rack 3 by balancing the quantity of air to be used for cooling the rack 3 and the supplied quantity of air from the air conditioner 2, the rack 3 can be efficiently and properly cooled by decreasing the waste of the cooling air from the air conditioner 2.

Second Embodiment

In the following embodiment, a configuration and a process of an air conditioning installation 100 according to a second embodiment will be described, and then advantages attained by the second embodiment will be described.

[Configuration of Air Conditioning System]

Figure 2:
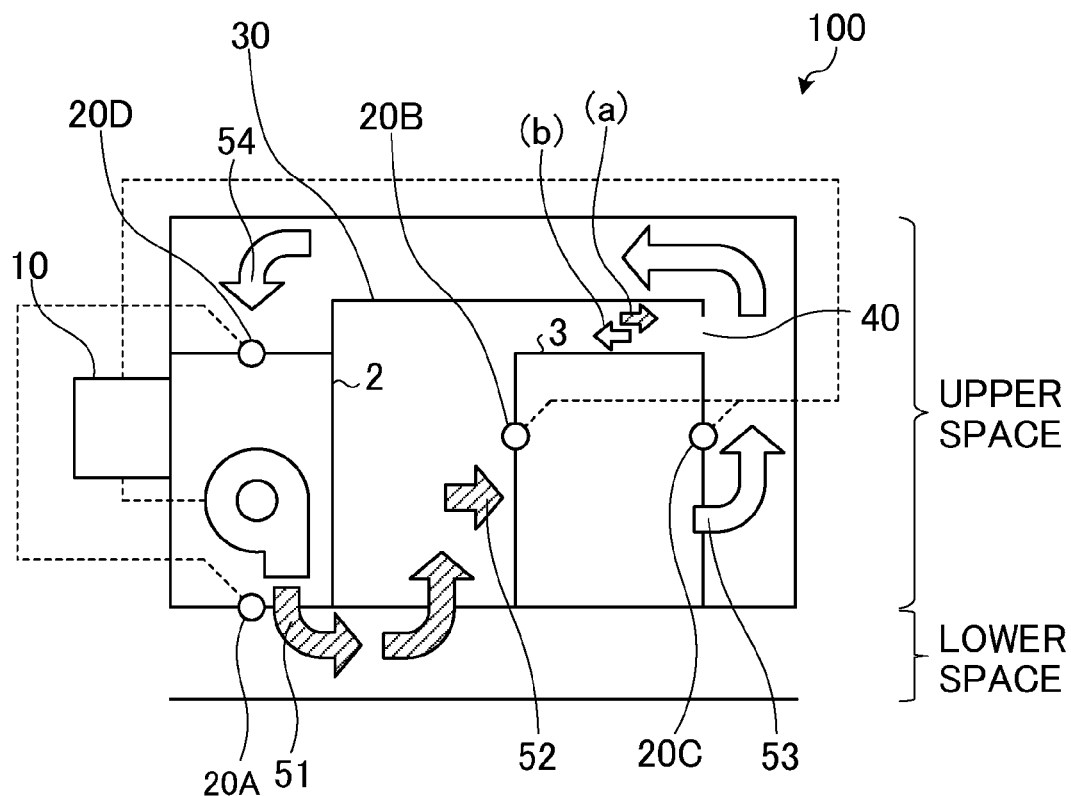
FIG. 2 is a block diagram of a configuration of an air conditioning installation according to a second embodiment.

The configuration of the air conditioning installation 100 according to the second embodiment will be described with reference to FIG. 2. FIG. 2 is a block diagram of the configuration of the air conditioning installation 100 according to the second embodiment. Referring to FIG. 2, the air conditioning installation 100 includes an air conditioner 2, a rack 3, an air conditioning control unit 10 serving as an air quantity control unit, temperature detectors 20A to 20D, an exhaustion guide path 30, and an air hole 40. The air conditioning control unit 10 is connected with the temperature detectors 20A to 20D through a LAN.

The air conditioning installation 100 has a double floor structure providing a space below a floor (upper space) and a space above the floor (lower space). The rack 3 is installed on the floor (in the space above the floor). In the air conditioning installation 100, the cooling air blown from the air conditioner 2 passes through the space below the floor, and is supplied to the rack 3. In FIG. 2, hatched arrows indicate the flow of the cooling air, and white arrows indicate the flow of the heated air.

The air conditioner 2 blows the cooling air 51 to the rack 3 from an outlet (not illustrated in FIG. 2) of the air conditioner 2, and takes in the heated air 54 exhausted from the rack 3 through an inlet (not illustrated in FIG. 2) of the air conditioner 2. In particular, the air conditioner 2 supplies the cooling air 52 to the rack 3 installed on the floor (in the space above the floor) by blowing the cooling air 51 to the space below the floor. Since the rack 3 has IT devices mounted thereon, the rack 3 receives the cooling air 52 supplied from the air conditioner 2 through an inlet (not illustrated in FIG. 2) of the rack 3, and exhausts the heated air 53 to the space above the floor through an exhaust outlet (not illustrated in FIG. 2) of the rack 3.

The exhaustion guide path 30 is a structure that separates an aisle into a hot aisle and a cool aisle. The hot aisle is an area included in the space above the floor where the rack 3 is installed. Only the heated air from the rack 3 is collected in this area. In the embodiment illustrated in FIG. 2, the heated air indicated by the white arrows is circulated in this area. The cool aisle is an area in which only the cooling air blown from the air conditioner 2 is collected. In the embodiment illustrated in FIG. 2, the cooling air indicated by the hatched arrows is circulated in this area. The air hole 40 is a hole that allows the air in the hot aisle and the air in the cool aisle to be exchanged.

The air conditioner blow temperature detector 20A detects an air conditioner blow temperature that is the temperature of the cooling air 51 blown from the outlet of the air conditioner 2 to the rack 3. The rack introduction temperature detector 20B detects a rack introduction temperature that is the temperature of the cooling air 52 when the rack 3 receives the cooling air through the inlet of the rack 3. The rack exhaustion temperature detector 20C detects a rack exhaustion temperature that is the temperature of the heated air 53 exhausted from the exhaust outlet of the rack 3, which has received the cooling air 52. The air conditioner return temperature detector 20D detects an air conditioner return temperature that is the temperature of the heated air 54 when the air conditioner 2 takes in through the inlet of the air conditioner 2.

Figure 3:
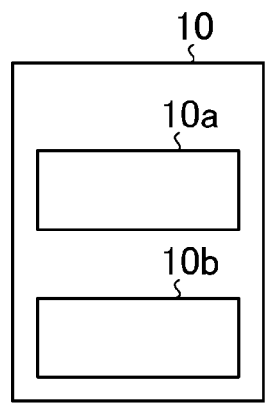
FIG. 3 is a block diagram of a configuration of an air conditioning control unit according to the second embodiment.

The air conditioning control unit 10 controls the quantity of air from the air conditioner 2 in accordance with the temperatures detected by the temperature detectors 20A to 20D. Now, a detailed configuration of the air conditioning control unit 10 will be described with reference to FIG. 3. FIG. 3 is a block diagram of the configuration of the air conditioning control unit 10 according to the second embodiment. Referring to FIG. 3, the air conditioning control unit 10 includes a temperature judgment unit 10a and an air quantity control unit 10b.

The temperature judgment unit 10a judges whether the rack exhaustion temperature detected by the rack exhaustion temperature detector 20C is higher than the air conditioner return temperature detected by the air conditioner return temperature detector 20D. The temperature judgment unit 10a also judges whether the rack introduction temperature detected by the rack introduction temperature detector 20B is higher than the air conditioner blow temperature detected by the air conditioner blow temperature detector 20A.

In particular, the temperature judgment unit 10a acquires in real time the information of the temperatures detected by the temperature detectors 20A to 20D through the LAN. To judge whether the rack exhaustion temperature "Tr_out" detected by the rack exhaustion temperature detector 20C is higher than the air conditioner return temperature "Tac_in" detected by the air conditioner return temperature detector 20D, the temperature judgment unit 10a judges whether a condition "Tr_out"−"Tac_in">0 is satisfied.

If the temperature judgment unit 10a judges that the condition "Tr_out"−"Tac_in">0 is satisfied, the temperature judgment unit 10a gives the air quantity control unit 10b an instruction to decrease the quantity of air from the air conditioner 2. In contrast, if the temperature judgment unit 10a judges that the condition "Tr_out"−"Tac_in">0 is not satisfied, in order to judge whether the rack introduction temperature "Tr_in" is higher than the air conditioner blow temperature "Tac_out," the temperature judgment unit 10a judges whether a condition "Tr_in"−"Tac_out">0 is satisfied.

If the temperature judgment unit 10a judges that the condition "Tr_in"−"Tac_out">0 is satisfied, the temperature judgment unit 10a gives the air quantity control unit 10b an instruction to increase the quantity of air from the air conditioner 2. In contrast, if the temperature judgment unit 10a judges that the condition "Tr_in"−"Tac_out">0 is not satisfied, the temperature judgment unit 10a does not control the air quantity.

The air quantity control unit 10b controls the quantity of air from the air conditioner 2 to decrease the difference between the air conditioner blow temperature detected by the air conditioner blow temperature detector 20A and the rack introduction temperature detected by the rack introduction temperature detector 20B. Also, the air quantity control unit 10b controls the quantity of air from the air conditioner 2 to decrease the difference between the rack exhaustion temperature detected by the rack exhaustion temperature detector 20C and the air conditioner return temperature detected by the air conditioner return temperature detector 20D.

In particular, if the air quantity control unit 10b receives the instruction to decrease the quantity of air from the air conditioner 2 from the temperature judgment unit 10a, which has judged that the rack exhaustion temperature is higher than the air conditioner return temperature, the air quantity control unit 10b decreases the quantity of air from the air conditioner 2.

In contrast, if the air quantity control unit 10b receives the instruction to increase the quantity of air from the air conditioner 2 from the temperature judgment unit 10a, which has judged that the rack introduction temperature is higher than the air conditioner blow temperature, the air quantity control unit 10b increases the quantity of air from the air conditioner 2.

In other words, the air conditioning control unit 10 determines that the cooling air is excessive if it is judged that the rack exhaustion temperature is higher than the air conditioner return temperature. For example, in the embodiment illustrated in FIG. 2, if the rack exhaustion temperature is higher than the air conditioner return temperature, it may be considered that the air at the rack exhaustion temperature is cooled by the cooling air (indicated by arrow (a) in FIG. 2) flowing through the air hole 40. The cooling air is excessive.

The air conditioning control unit 10 decreases the quantity of air from the air conditioner 2. Thus, the quantity of the heated air in the hot aisle and the quantity of the cooling air in the cool aisle can be balanced, and the energy can be saved.

In some cases, the temperature of the heated air exhausted from the rack 3 may be decreased before the heated air is taken in by the air conditioner 2 not because of the cooling air flowing through the air hole 40. It may be judged whether the rack exhaustion temperature "Tr_out" is higher by a predetermined threshold value than the air conditioner return temperature "Tac_in" detected by the air conditioner return temperature detector 20D.

For example, the air conditioning control unit 10 may set "2° C." as the predetermined threshold value. In this case, the air conditioning control unit 10 judges whether a condition "Tr_out"−"Tac_in"≥2° C. is satisfied. If the condition "Tr_out"−"Tac_in"≥2° C. is satisfied, the air conditioning control unit 10 decreases the air quantity.

Also, the air conditioning control unit 10 determines that the cooling air is insufficient if the rack introduction temperature is higher than the air conditioner blow temperature. For example, in the embodiment illustrated in FIG. 2, if the rack introduction temperature is higher than the air conditioner blow temperature, it may be considered that the quantity of the cooling air is insufficient. It may be considered that the air at the rack introduction temperature is heated by the heated air (indicated by arrow (b) in FIG. 2) flowing through the air hole 40. The cooling air is insufficient.

The air conditioning control unit 10 increases the quantity of air from the air conditioner 2. Thus, the quantity of the heated air in the hot aisle and the quantity of the cooling air in the cool aisle can be balanced, and the rack 3 can be properly cooled.

In some cases, the temperature of the cooling air blown from the air conditioner 2 may be increased before the cooling air is received by the rack 3 not because of the heated air flowing through the air hole 40. It may be judged whether the rack introduction temperature "Tr_in" is higher by a predetermined threshold value than the air conditioner blow temperature "Tac_out."

For example, the air conditioning control unit 10 may set "2° C." as the predetermined threshold value. In this case, it is judged whether a condition "Tr_in"−"Tac_out"≥2° C. is satisfied. If the condition "Tr_in"−"Tac_out"≥2° C. is satisfied, the air conditioning control unit 10 increases the air quantity.

Although the single air conditioner 2 cools the single rack 3 in the embodiment in FIG. 2, a single air conditioner 2 may typically cool a plurality of racks 3. In this case, the rack introduction temperature detector 20B and the rack exhaustion temperature detector 20C are provided for each rack. The air conditioning control unit 10 acquires in real time the information of the temperatures detected by the rack introduction temperature detector 20B and the rack exhaustion temperature detector 20C of each rack.

The air conditioning control unit 10 calculates the average of rack exhaustion temperatures of the respective racks 3. The air conditioning control unit 10 handles the calculated value as a rack exhaustion temperature. The air conditioning control unit 10 controls the quantity of air from the air conditioner 2 to decrease the difference between the calculated average of the rack exhaustion temperatures and the air conditioner return temperature.

Also, the air conditioning control unit 10 handles the highest rack introduction temperature from among rack introduction temperatures of the respective racks 3 as a rack introduction temperature. The air conditioning control unit 10 controls the quantity of air from the air conditioner 2 to decrease the difference between the highest rack introduction temperatures and the air conditioner blow temperature. That is, if the plurality of racks 3 are provided, the racks 3 are cooled in accordance with the rack 3 at the highest introduction temperature because it is desirable to cool all racks 3 properly.

[Process by Air Conditioning System]

Figure 4:
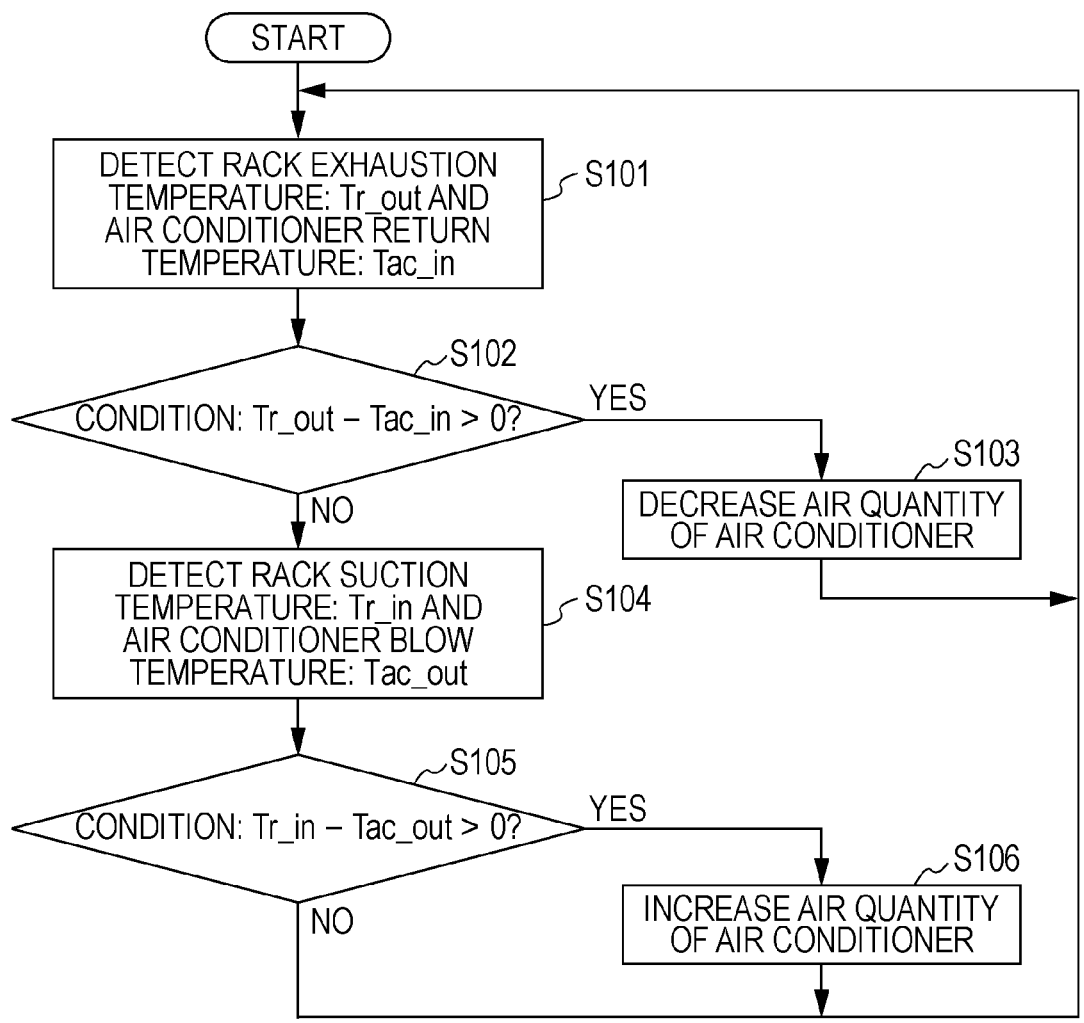
FIG. 4 is a flowchart explaining a process of the air conditioning installation according to the second embodiment.

A process by the air conditioning installation 100 according to the second embodiment will be described with reference to FIG. 4. FIG. 4 is a flowchart explaining the process of the air conditioning installation according to the second embodiment.

Referring to FIG. 4, the rack exhaustion temperature detector 20C in the air conditioning installation 100 detects the rack exhaustion temperature "Tr_out" that is the temperature of the heated air exhausted from the rack 3, which has received the cooling air blown from the air conditioner 2. In addition, the air conditioner return temperature detector 20D detects the air conditioner return temperature "Tac_in" that is the temperature of the heated air when the air conditioner 2 takes in (step S101).

The air conditioning control unit 10 judges whether the condition "Tr_out"−"Tac_in">0 is satisfied (step S102). If the air conditioning control unit 10 judges that the condition "Tr_out"−"Tac_in">0 is satisfied (YES in step S102), the air conditioning control unit 10 controls the air conditioner 2 to decrease the quantity of air from the air conditioner 2 (step S103).

In contrast, if the air conditioning control unit 10 judges that the condition "Tr_out"−"Tac_in">0 is not satisfied (NO in step S102), the rack introduction temperature detector 20B detects the rack introduction temperature "Tr_in" that is the temperature of the cooling air when the rack 3 receives the cooling air. In addition, the air conditioner blow temperature detector 20A detects the air conditioner blow temperature "Tac_out" that is the temperature of the cooling air blown from the air conditioner 2 to the rack 3 (step S104).

The air conditioning control unit 10 judges whether the condition "Tr_in"−"Tac_out">0 is satisfied (step S105). If the air conditioning control unit 10 judges that the condition "Tr_in"−"Tac_out">0 is satisfied (YES in step S105), the air conditioning control unit 10 controls the air conditioner 2 to increase the quantity of air from the air conditioner 2 (step S106). In contrast, if the air conditioning control unit 10 judges that the condition "Tr_in"−"Tac_out">0 is not satisfied (NO in step S105), the air conditioning control unit 10 does not change the quantity of air from the air conditioner 2, and the process returns to step S101.

Advantages of Second Embodiment

As described above, in the air conditioning installation 100, the air conditioner blow temperature that is the temperature of the cooling air blown from the air conditioner to the rack is detected; and the rack introduction temperature that is the temperature of the cooling air when the rack receives the cooling air is detected. Then, the air conditioning installation 100 controls the quantity of air from the air conditioner to decrease the difference between the detected air conditioner blow temperature and the detected rack introduction temperature. Thus, the air conditioning installation 100 can efficiently and properly cool the rack by balancing the quantity of air to be used for cooling the rack and the supplied quantity of air from the air conditioner and hence by decreasing the waste of the cooling air from the air conditioner.

Also, in the air conditioning installation 100 according to the second embodiment, it is judged whether the rack introduction temperature detected by the rack introduction temperature detector is higher than the air conditioner blow temperature. If it is judged that the rack introduction temperature is higher than the air conditioner blow temperature, the quantity of air from the air conditioner is increased. That is, if the rack introduction temperature is higher than the air conditioner blow temperature, the quantity of the cooling air is insufficient and hence the heated air flows through the air hole, resulting in the cooling air being heated. The cooling air is insufficient.

The air conditioning control unit 10 increases the quantity of air from the air conditioner 2. Thus, the rack can be properly cooled by balancing the quantity of air to be used for cooling the rack and the supplied quantity of air from the air conditioner.

Further, in the air conditioning installation 100 according to the second embodiment, when the plurality of racks are provided, the quantity of air from the air conditioner is controlled to decrease the difference between the highest rack introduction temperature from among the plurality of rack introduction temperatures and the air conditioner blow temperature. Accordingly, the waste of the cooling air from the air conditioner can be decreased, and hence the plurality of racks can be efficiently and properly cooled.

Further, in the air conditioning installation 100 according to the second embodiment, the rack exhaustion temperature that is the temperature of the heated air exhausted from the rack is detected, the rack which has received the cooling air blown from the air conditioner; the air conditioner return temperature that is the temperature of the heated air when the air conditioner takes in is detected; and the quantity of air from the air conditioner is controlled to decrease the difference between the rack exhaustion temperature and the air conditioner return temperature. Thus, the air conditioning installation 100 can efficiently and properly cool the rack by balancing the quantity of air to be used for cooling the rack and the supplied quantity of air from the air conditioner and hence by decreasing the waste of the cooling air from the air conditioner.

Further, in the air conditioning installation 100 according to the second embodiment, it is judged whether the detected rack exhaustion temperature is higher than the air conditioner return temperature. If it is judged that the rack exhaustion temperature is higher than the air conditioner return temperature, the quantity of air from the air conditioner is decreased. That is, if the rack exhaustion temperature is higher than the air conditioner return temperature, it may be considered that the air at the rack exhaustion temperature is cooled by the cooling air (indicated by arrow (a) in FIG. 2) flowing through the air hole 40. The cooling air is excessive.

In the air conditioning installation 100, the quantity of air from the air conditioner is decreased. Thus, the rack can be efficiently cooled by balancing the quantity of air to be used for cooling the rack and the supplied quantity of air from the air conditioner and hence by decreasing the waste of the cooling air from the air conditioner.

Further, in the air conditioning installation 100 according to the second embodiment, when the plurality of racks are provided, the average of the plurality of detected rack exhaustion temperatures are calculated, and the quantity of air from the air conditioner is controlled to decrease the difference between the averaged rack exhaustion temperature and the air conditioner return temperature. Accordingly, the waste of the cooling air from the air conditioner can be decreased, and hence the plurality of racks can be efficiently and properly cooled.

Third Embodiment

While the embodiments of the invention have been described above, the embodiments may be implemented in various forms other than those of the above-described embodiments. Hence, another embodiment included in the invention will be described below as a third embodiment.

(1) Local Air Conditioner

In the second embodiment, the quantity of air from the main air conditioner has been controlled. In this embodiment, it is not limited thereto. If a local air conditioner relatively smaller than the main air conditioner is installed, the quantity of air from the local air conditioner may be controlled.

Figure 5:
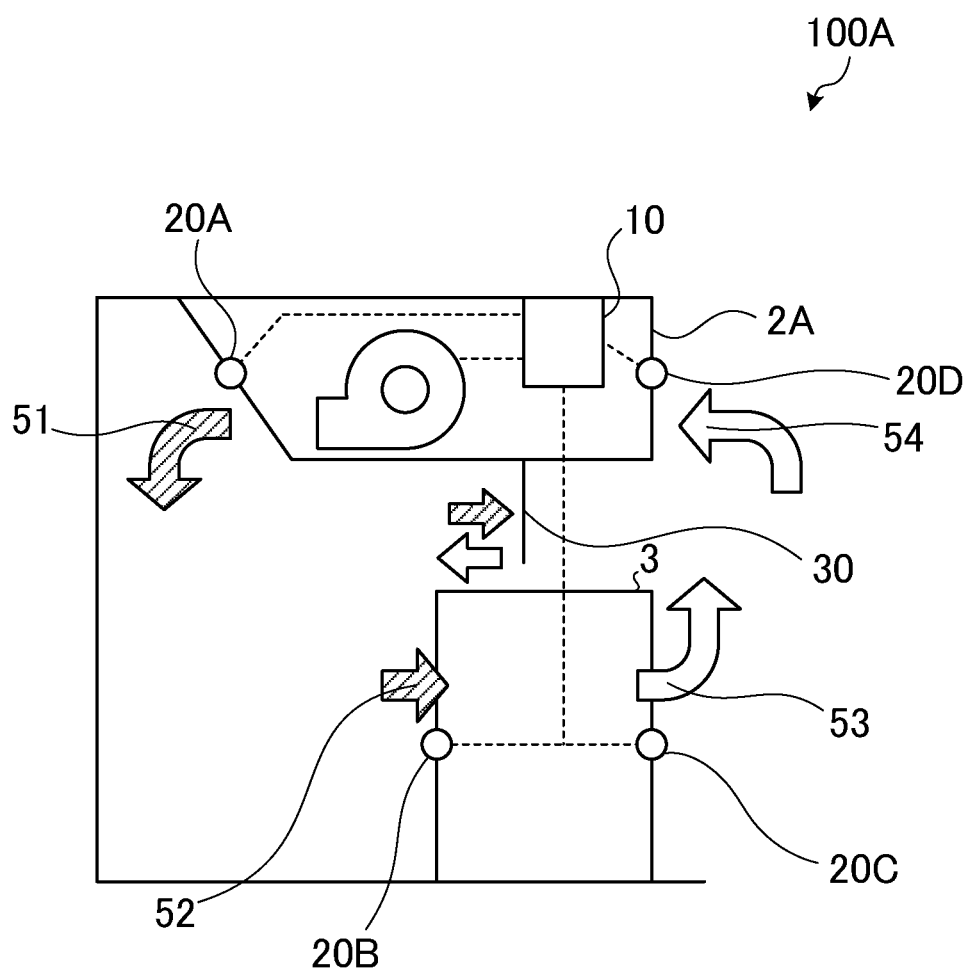
FIG. 5 is a block diagram of a configuration of an air conditioning installation according to a third embodiment.

In this embodiment, a configuration of an air conditioning installation 100A according to the third embodiment will be described with reference to FIG. 5 as a case in which the quantity of air from a local air conditioner 2A is controlled. FIG. 5 is a block diagram of the configuration of the air conditioning installation 100A according to the third embodiment.

Referring to FIG. 5, the air conditioning installation 100A according to the third embodiment includes the local air conditioner 2A installed above a rack. In addition, an exhaustion guide path 30 is provided below the local air conditioner 2A. The exhaustion guide path 30 divides an aisle into a hot aisle and a cool aisle. The local air conditioner 2A does not have to be provided above the rack, and may be provided near the position at which a hot spot is generated, so as to increase the cooling performance and air quantity. The processes carried out by the air conditioning control unit 10 and the temperature detectors 20A to 20D are similar to those in the second embodiment.

(2) System Configuration

The components of the illustrated devices and units represent concepts of functions. The components do not have to be physically arranged as illustrated. In particular, the specific forms of the devices and units in terms of division and combination are not limited to the illustrated forms. All the devices and units, or part of the devices and units may be functionally or physically divided into smaller devices and units, or combined to define larger devices and units by the desirable unit basis depending on various loads and use conditions to be considered. For example, the temperature judgment unit 10a may be combined with the air quantity control unit 10b. Further, all or part of the processing functions carried out by the devices and units may be attained by a CPU or a program that is analytically executed by the CPU. Alternatively, the processing functions may be attained by hardware based on a wired logic.

(3) Program

Figure 6:
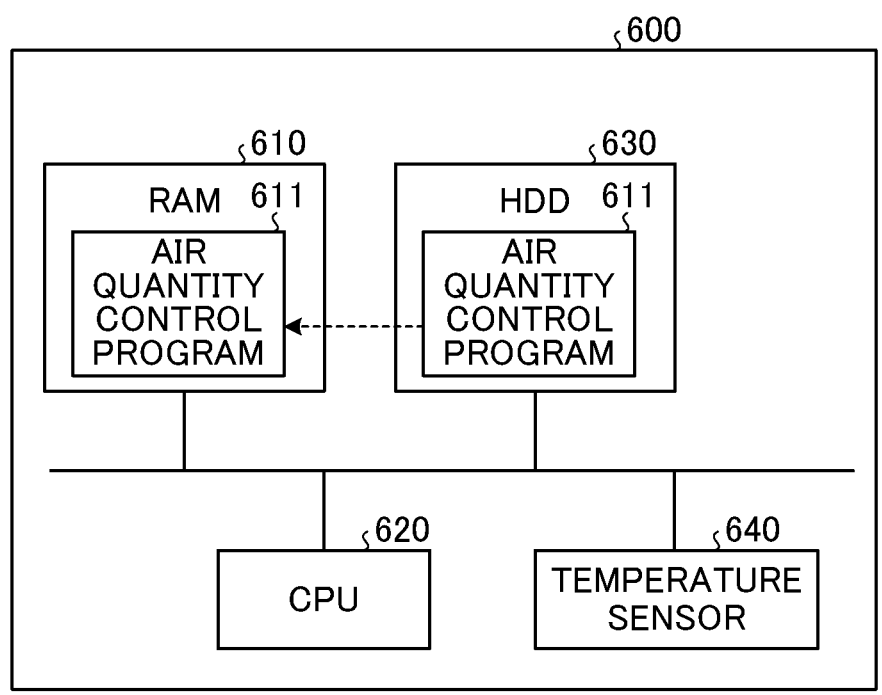
FIG. 6 illustrates a computer that executes an air quantity control program.

The processes of the air quantity control unit 5 described in the first embodiment may be attained by executing a predetermined program with a personal computer or a computer system such as a workstation. Now, an example of a computer that executes an air quantity control program 711 serving as an air conditioning control program having a function similar to the first embodiment will be described below with reference to FIG. 6. FIG. 6 illustrates a computer 600 that executes the air quantity control program 611.

Referring to FIG. 6, the computer 600 serving as an air quantity control device includes a RAM 610, a CPU 620, a HDD 630, and a temperature sensor 640, which are connected with one another through a bus or the like.

The temperature sensor 640 detects a blow temperature of an air conditioner, a return temperature of the air conditioner, a introduction temperature of a rack, and an exhaustion temperature of the rack. The HDD 630 stores information for executing various processes by the CPU 620. The RAM 610 temporarily stores various pieces of information. The CPU 620 executes various arithmetic processes.

Referring to FIG. 6, the HDD 630 previously stores the air quantity control program 611 that provides functions similar to those of respective processing units of the air quantity control unit described in the second embodiment. The air quantity control program 611 may be divided, and stored in a storage portion of another computer that is connected to the computer 600 such that communication may be held therebetween through a network.

The CPU 620 reads the air quantity control program 611 from the HDD 630, and develops the read air quantity control program 611 in the RAM 610. The air quantity control program 611 reads the various data from the HDD 630 and develops the data in a region of the RAM 610, the region which is allocated to the air quantity control program 611. The various processes are executed on the basis of the developed data etc.

The air quantity control program 611 does not have to be previously stored in the HDD 630. For example, programs may be stored in a "portable physical media" that is inserted into the computer 600, such as, a flexible disk (FD), a CD-ROM, a DVD, a magneto-optical disk, or an IC card; or "another computer (or server)" that is connected with the computer 600 through a public line, the Internet, a LAN, or a WAN. The computer 600 may read the programs from such a media or computer and execute the programs.

The disclosed system efficiently and properly cools the rack by decreasing the waste of the cooling air from the air conditioner.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An installation for cooling an electronic device provided in a room, comprising:
    an air conditioner having an air inlet for receiving air from the room and an air outlet for blowing cooling air to the room;
    an air conditioner return temperature detector adjacent to the air inlet of the air conditioner, for detecting a temperature of the air from the room;
    a rack accommodating the electronic device, the rack having an air inlet for receiving the cooling air from the air conditioner and an air outlet for exhausting air to the room;
    a rack exhaustion temperature detector adjacent to the air outlet of the rack, for detecting a temperature of air exhausting through the air outlet of the rack;
    an air conditioner blow temperature detector adjacent to the air outlet of the air conditioner, for detecting a temperature of air conditioner blow;
    a rack introduction temperature detector adjacent to the air inlet of the rack, for detecting a temperature of air introducing through the air inlet of the rack; and
    a controller for acquiring the temperature detected by the air conditioner return temperature detector, the rack exhaustion temperature detector, the air conditioner blow temperature detector and the rack introduction temperature detector, and controlling a quantity of the cooling air blown from the air outlet of the air conditioner;
    wherein the controller causes a decrease in the quantity of the cooling air when the temperature detected by the rack exhaustion temperature detector is larger than the temperature detected by the air conditioner return temperature detector so as to decrease a difference between the temperatures detected by the air conditioner blow temperature detector and the rack introduction temperature detector, and the controller causes an increase in the quantity of the cooling air when the temperature detected by the rack introduction temperature detector is larger than the temperature detected by the air conditioner blow temperature detector so as to decrease a difference between the temperatures detected by the air conditioner blow temperature detector and the rack introduction temperature detector.

2. The installation according to claim 1, further comprising:
    another rack; and
    another rack exhaustion temperature detector, the controller acquiring the temperature detected by the another rack exhaustion temperature detector, detecting an average of the temperatures of the air respectively exhausting through the air outlets of the rack and the another rack, and controlling the quantity of the cooling air blown from the air outlet of the air conditioner so as to decrease a difference between the temperature detected by the rack exhaustion temperature detector and the average.

3. The installation according to claim 1, further comprising:
    a first channel for sending the air exhausted from the air outlet of the rack to the inlet of the air inlet of the air conditioner; and
    a second channel for sending the cooling air blown from the air outlet of the air conditioner to the inlet of the rack, the first channel and the second channel being connected to each other.

4. A method for cooling an electronic device accommodated in a rack, provided in a room, the rack having an air inlet for receiving cooling air from an air conditioner controlled by a computer and an air outlet for exhausting air to the room, the method comprising:
    receiving air from the room through an inlet of the air conditioner;
    blowing cooling air to the room through an outlet of the air conditioner;
    detecting an air conditioner return temperature by an air conditioner return temperature detector adjacent to the air inlet of the air conditioner, for detecting a temperature of the air from the room;
    detecting a rack exhaustion temperature by a rack exhaustion temperature detector adjacent to the air outlet of the rack, for detecting a temperature of air exhausting through the air outlet of the rack;
    detecting an air conditioner blow temperature by an air conditioner blow temperature detector adjacent to the air outlet of the air conditioner, for detecting a temperature of air conditioner blow;
    detecting a rack introduction temperature by a rack introduction temperature detector adjacent to the air inlet of the rack, for detecting a temperature of air through the air inlet of the rack;
    acquiring temperatures from the air conditioner return temperature detector, the rack exhaustion temperature detector, the air conditioner blow temperature detector, and the rack introduction temperature detector; and
    controlling the air conditioner to decrease in the quantity of the cooling air when the temperature detected by the rack exhaustion temperature detector is larger than the temperature detected by the air conditioner return temperature detector so as to decrease a difference between the temperatures detected by the air conditioner blow temperature detector and the rack introduction temperature detector, and controlling the air conditioner to increase in the quantity of the cooling air when the temperature detected by the rack introduction temperature detector is larger than the temperature detected by the air conditioner blow temperature detector so as to decrease a difference between the temperatures detected by the air conditioner blow temperature detector and the rack introduction temperature detector.

* * * * *